US012784856B2

(12) United States Patent
Khor

(10) Patent No.: US 12,784,856 B2
(45) Date of Patent: Nov. 3, 2026

(54) BUILT-IN-SELF-TEST CIRCUITS AND METHODS IN SECTORS OF INTEGRATED CIRCUITS

(71) Applicant: Intel Corporation, Santa Clara, CA (US)

(72) Inventor: Kok Wah Khor, Nibong Tebal (MY)

(73) Assignee: Altera Corporation, San Jose, CA (US)

( * ) Notice: Subject to any disclaimer, the term of this patent is extended or adjusted under 35 U.S.C. 154(b) by 194 days.

(21) Appl. No.: 17/747,808

(22) Filed: May 18, 2022

(65) Prior Publication Data

US 2022/0277799 A1 Sep. 1, 2022

(51) Int. Cl.
*G11C 29/12* (2006.01)
*G11C 29/18* (2006.01)

(52) U.S. Cl.
CPC .............. *G11C 29/12* (2013.01); *G11C 29/18* (2013.01)

(58) Field of Classification Search
CPC .............. G11C 29/12005; G11C 29/42; G11C 2029/1202; G11C 29/52; G11C 8/08; G11C 29/025; G11C 16/08; G11C 16/26; G11C 29/12; G06F 11/1048
See application file for complete search history.

(56) References Cited

U.S. PATENT DOCUMENTS 4,969,148 A * 11/1990 Nadeau-Dostie ...... G11C 29/16 714/743
6,327,683 B1 * 12/2001 MacCormack ........ G11C 29/32 714/726
6,493,839 B1 * 12/2002 Miner .................... G11C 29/56 714/31
6,550,023 B1 * 4/2003 Brauch .................. G11C 29/40 714/719
6,560,740 B1 * 5/2003 Zuraski, Jr. ........ G01R 31/3187 714/733
6,686,759 B1 * 2/2004 Swamy .......... G01R 31/318558 324/76.63
6,687,865 B1 * 2/2004 Dervisoglu .... G01R 31/318385 714/729
6,839,873 B1 * 1/2005 Moore ............ G01R 31/31704 326/38
7,134,059 B2 * 11/2006 Jeon ..................... G11C 7/1078 714/724
7,475,315 B1 * 1/2009 Natarajan .............. G11C 29/16 714/719
7,707,472 B1 4/2010 Dastidar
(Continued)

*Primary Examiner* — Steve N Nguyen
(74) *Attorney, Agent, or Firm* — InventIQ Legal LLP; Steven J. Cahill

(57) ABSTRACT

An integrated circuit includes sectors of logic circuits. Each of the sectors of logic circuits includes a local sector manager controller circuit that provides an indication to perform a memory test. Each of the sectors also includes a built-in-self-test circuit that is configurable to generate a control signal and expected data in response to the indication to perform the memory test. Each of the sectors also includes a memory circuit that outputs read data in response to the control signal during the memory test. Each of the sectors further includes a comparator circuit configurable to compare the read data with the expected data during the memory test to generate a test result that is provided to the built-in-self-test circuit.

20 Claims, 7 Drawing Sheets

(56) References Cited

U.S. PATENT DOCUMENTS

| | | | | |
|---|---|---|---|---|
| 7,802,157 | B2 * | 9/2010 | Pekny | G01R 31/31701 714/724 |
| 9,098,486 | B1 | 8/2015 | Tan et al. | |
| 11,257,562 | B2 | 2/2022 | Tan | |
| 2004/0243898 | A1 * | 12/2004 | Reynolds, Jr. | G11C 29/12015 714/733 |
| 2005/0193293 | A1 * | 9/2005 | Shikata | G11C 29/14 714/718 |
| 2007/0266288 | A1 * | 11/2007 | Volkerink | G01R 31/31907 714/738 |
| 2009/0116321 | A1 * | 5/2009 | Shirur | G11C 29/20 365/201 |
| 2015/0262710 | A1 * | 9/2015 | Chakravarty | G11C 29/38 714/718 |

* cited by examiner

BUILT-IN-SELF-TEST CIRCUITS AND METHODS IN SECTORS OF INTEGRATED CIRCUITS

FIELD OF THE DISCLOSURE

The present disclosure relates to electronic integrated circuits, and more particularly, to built-in-self-test circuits and methods in sectors of integrated circuits.

BACKGROUND

Memory blocks containing memory circuits are often fabricated as part of electronic integrated circuits. For example, application-specific integrated circuits and programmable logic integrated circuits such as field programmable gate array (FPGA) integrated circuits may contain memory blocks. Memory blocks may be provided as arrays of random-access memory (RAM) circuits. The memory blocks are used to handle the storage needs of the circuitry on a given integrated circuit. During normal operation of the integrated circuit, read and write operations are performed on the memory blocks.

DETAILED DESCRIPTION

Figure 1:
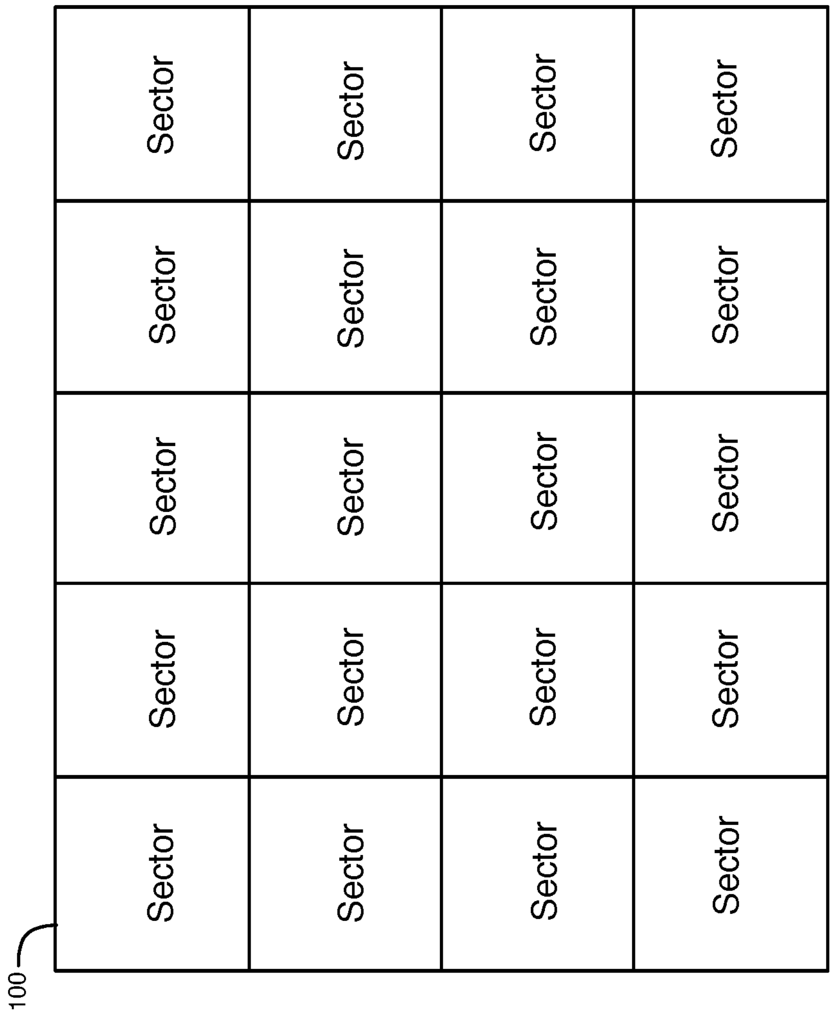
FIG. 1 is a diagram that illustrates an example of an integrated circuit (IC) that contains sectors of logic circuits arranged in 4 rows and 5 columns.

Field programmable gate array (FPGA) integrated circuits (ICs) often have many distributed memory blocks of memory circuits. If the memory blocks are crucial in a system design, a single bit failure may cause breakdown of the system. To ensure satisfactory operation of an integrated circuit that contains memory blocks, the memory blocks are usually tested during debug and design operations. Testing may also be performed during manufacturing. However, it can be difficult to perform high-speed memory tests using only external test equipment. It is therefore often desirable to include internal test support circuitry in an integrated circuit to facilitate memory block tests. Because the internal test circuitry is incorporated into the integrated circuit that is to be tested, this type of test circuitry is often referred to as built-in-self-test (BIST) circuitry.

Built-in-self-test (BIST) circuits are typically inserted in the design phase of an integrated circuit to enable high volume manufacturing (HVM) tests for memory circuits in the integrated circuit. To achieve high quality test coverage, BIST circuits are optimized to operate at full clock speed. A BIST circuit can supply a memory circuit with test data while systematically stepping through the addresses for the memory circuit. If an unexpected result is detected in response to certain test data, the BIST circuit can conclude that the memory circuit contains an error. Appropriate debugging or manufacturing repair operations may then be performed.

According to some examples disclosed herein, an integrated circuit (IC) has one or more sectors that include memory circuits. Each of the sectors also has a BIST circuit that is used to perform tests of the memory circuits in the corresponding sector. Each sector may have a local system manager (LSM) controller circuit. Each LSM controller controls the tests performed by the BIST circuits in the corresponding sector, for example, in response to input from an external host system. The BIST circuits can perform memory self-tests before the IC is used in production to ensure reliability of the memory circuits and the system containing the IC. If failure of the system occurs, the BIST circuits can be used as diagnostic tools to find the cause of the failure. The BIST circuits can also be used for production tests in manufacturing. Because the BIST circuits are in the sectors with the memory circuits, timing closure of at-speed built-in self-testing of the memory circuits can be more easily achieved, compared to centralized BIST circuits in an IC. The BIST circuits may be implemented by soft logic circuitry or by hard logic circuitry in the IC.

This disclosure discusses circuit systems that can be implemented in integrated circuit devices, including programmable logic ICs such as field programmable gate arrays (FPGAs). As discussed herein, circuit systems may use hard logic and soft logic of an FPGA. As used herein, “hard logic” generally refers to circuits in an integrated circuit device (e.g., a configurable integrated circuit) that are not programmable by an end user. The circuits in the integrated circuit device that are programmable by the end user are considered “soft logic.”

Throughout the specification, and in the claims, the term “connected” means a direct electrical connection between the circuits that are connected, without any intermediary devices. The term “coupled” means either a direct electrical connection between circuits or an indirect electrical connection through one or more passive or active intermediary devices. The term “circuit” may mean one or more passive and/or active electrical components that are arranged to cooperate with one another to provide a desired function.

One or more specific examples are described below. In an effort to provide a concise description of these examples, not all features of an actual implementation are described in the specification. It should be appreciated that in the development of any such actual implementation, as in any engineering or design project, numerous implementation-specific decisions must be made to achieve the developers’ specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

FIG. 1 is a diagram that illustrates an example of an integrated circuit (IC) 100 that contains 20 sectors arranged in 4 rows and 5 columns. Each of the sectors in IC 100 includes a built-in-self-test (BIST) circuit, one or more memory circuits, logic circuits, and possibly other circuits that are disclosed herein in FIGS. 2-4. In the example of FIG. 1, the IC 100 has 20 sectors. Although it should be understood that ICs containing BIST circuits may have any number of sectors. IC 100 may be any type of IC, for example, a programmable logic IC, a microprocessor IC, an application specific IC, or a graphics processing unit (GPU) IC.

Figure 2:
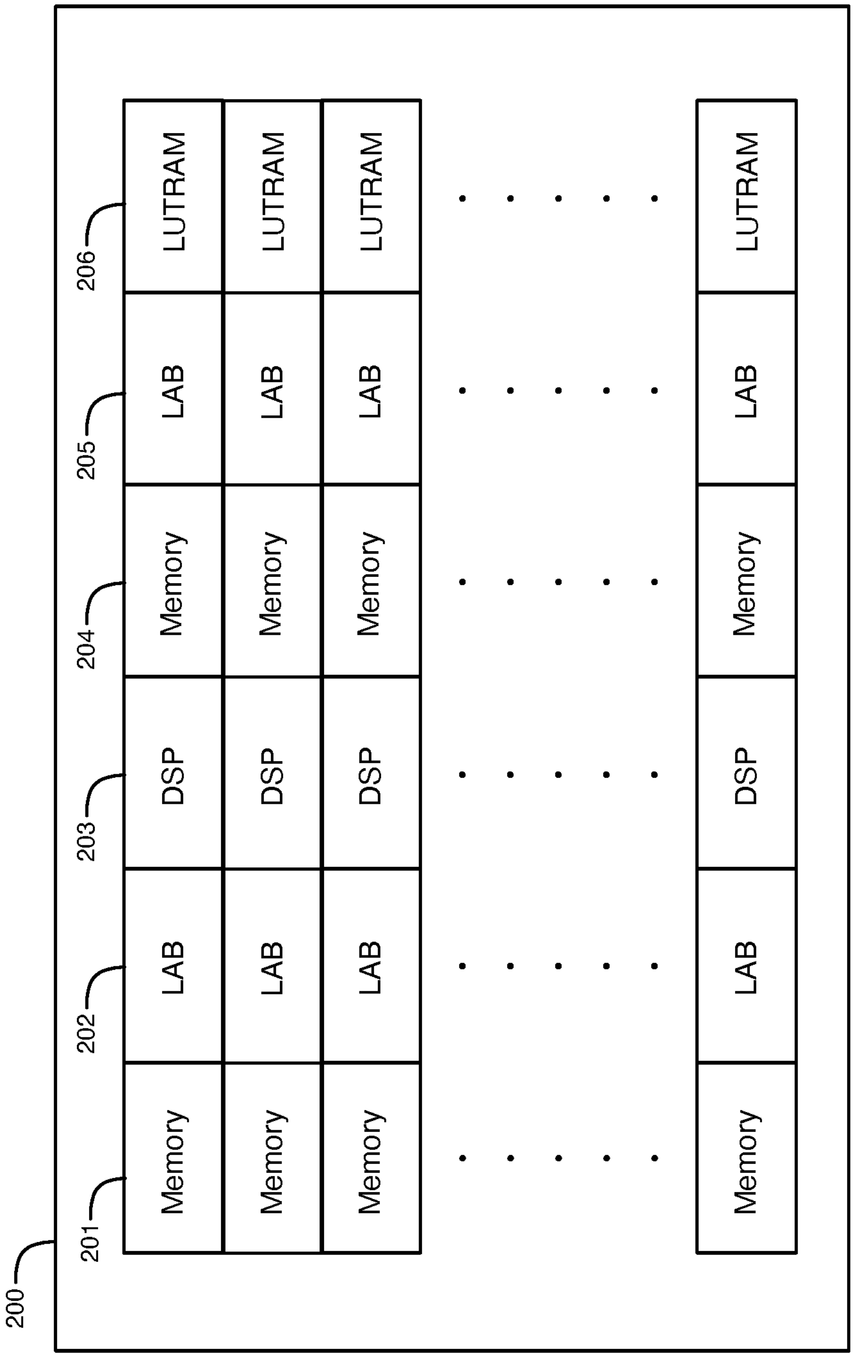
FIG. 2 is a diagram that illustrates a sector that is an example of each of the sectors shown in FIG. 1.

FIG. 2 is a diagram that illustrates a sector 200 that is an example of each of the sectors shown in FIG. 1 in IC 100. Sector 200 includes various types of logic circuits and memory circuits that are arranged in rows and columns. For example, sector 200 includes a first column 201 of memory circuits, a first column 202 of logic array blocks (LABs), a column 203 of digital signal processing (DSP) circuits, a second column 204 of memory circuits, a second column 205 of logic array blocks (LABs), and a column of look-up table random access memory (LUTRAM) blocks. LABs may, for example, include programmable logic circuits, such as look-up tables (LUTs) and sequential logic circuits (e.g., registers). The LUTRAM blocks may include random access memory circuits for the LUTs in the LABs. The memory circuits in columns 201 and 204 may include any types of memory circuits, such as random access memory, read-only memory, or non-volatile read/write memory. Although 6 columns are shown in FIG. 2, sector 200 may have any number of columns of memory circuits and logic circuits. Each of the columns may have any number of rows of memory circuits and logic circuits.

As shown in FIGS. 1-2, the memory circuits in the IC 100 are distributed across the IC. Therefore, if a centralized BIST circuit in IC 100 is used to test the memory circuits, it may be difficult to satisfy timing requirements for the tests due to the long routing between the memory circuits and the centralized BIST circuit. Providing a BIST circuit in each sector in the IC to be tested can substantially reduce the amount of routing between each BIST circuit and the memory circuits tested by the BIST circuit. As a result, the memory tests can be performed at greater frequencies so that the timing requirements for the memory tests can be satisfied.

Figure 3:
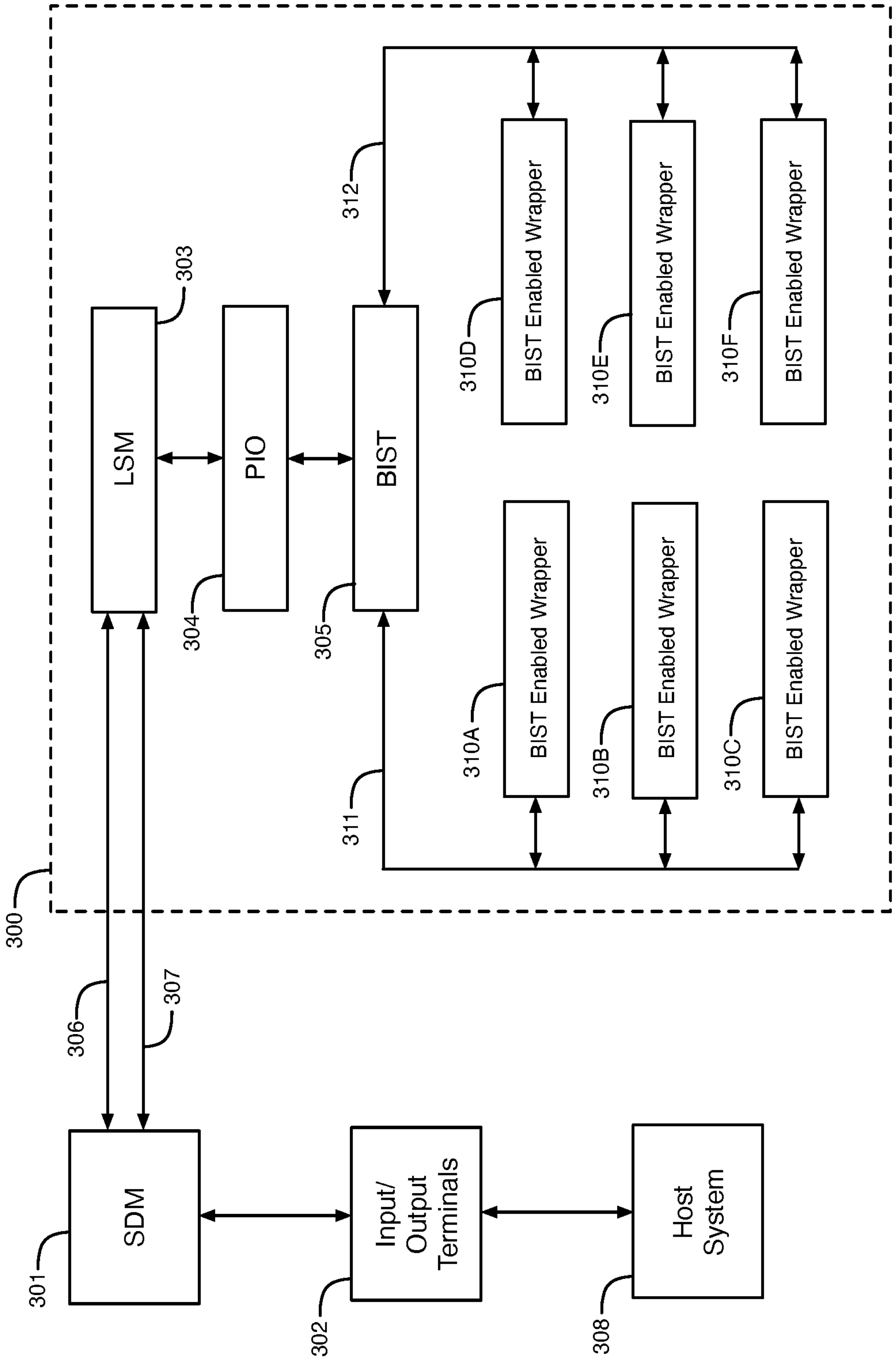
FIG. 3 is a diagram that illustrates circuits in the IC of FIG. 1 that can be used to perform built-in-self-tests of memory circuits in the sectors of the IC.

FIG. 3 is a diagram that illustrates circuits in the IC 100 of FIG. 1 that can be used to perform built-in-self-tests of memory circuits in the sectors of the IC. The circuits shown in FIG. 3 include circuitry 300, a secure device manager (SDM) controller circuit 301, input/output terminals 302, and host system 308. Circuits 300, 301, and 302 are in IC 100, and host system 308 is outside IC 100. An instance of circuitry 300 may, for example, be in each of the sectors in IC 100 that are shown in FIG. 1. Circuitry 300 may, for example, be in each sector 200. Circuitry 300 includes a local sector manager (LSM) controller circuit 303, a parallel input/output (PIO) interface 304, a memory built-in-self-test (BIST) circuit 305, and 6 BIST enabled wrapper circuits 310A-310F. Thus, in the example of FIG. 3, each sector in IC 100 can include a memory BIST circuit 305 for testing memory circuits in associated wrapper circuits 310.

Each sector in IC 100 may be managed by the local sector manager (LSM) controller circuit 303 in the sector. The LSM controller circuits 303 may be controlled by the secure device manager (SDM) controller circuit 301. Secure device manager (SDM) controller 301 may receive configuration data (e.g., configuration bit streams) and/or commands from a host system 308 through input/output terminals 302. SDM controller 301 may provide the received commands to the local sector manager (LSM) controllers 303 in the sectors over command bus 306. SDM controller 301 may provide the received configuration data to the LSM controllers 303 in the sectors over configuration bus 307. The sectors include logic circuits that are individually configurable or programmable using the configuration data in the associated local sector manager controller circuits 303.

The circuits shown in FIG. 3 can be used to perform high-speed tests of memory circuits in the sectors of IC 100. According to an example, host system 308 can generate one or more commands to perform memory tests of memory circuits in the sectors of IC 100. Each of the commands may be provided from host system 308 to SDM controller 301 through one or more of input/output terminals 302. Input/output terminals 302 are external terminals of the IC 100. Input/output terminals 302 may, for example, include Joint Test Action Group (JTAG) pads or pins. The commands to perform the memory tests in IC 100 may, for example, be provided through JTAG pins or pads that are at least a subset of the input/output terminals 302.

SDM controller 301 provides the commands to perform memory tests to the LSM controllers 303 in the sectors of IC 100 through bus 306 and/or bus 307. Each LSM controller 303 receives one or more of the commands to perform memory tests from the SDM controller 301. The LSM controller 303 in each sector includes firmware that controls the operation of one or more memory tests of the memory circuits in the sector. The memory tests are performed by BIST circuit 305. The LSM controller 303 provides control signals for controlling the memory tests to the BIST circuit 305 through the PIO interface 304 based on one or more of the commands to perform the memory tests received from SDM controller 301. BIST circuit 305 then performs the memory tests of the memory circuits in the BIST enabled wrapper circuits 310A-310F in response to the control signals received from LSM controller 303, as disclosed in further detail herein with respect to FIG. 4. BIST circuit 305 provides control, address, and data signals for performing the memory tests to wrapper circuits 310A-310C through bus 311 and to wrapper circuits 310D-310F through bus 312. Providing a local BIST circuit 305 in each sector in IC 100 allows a circuit designer to satisfy timing requirements for testing the memory circuits in the sector using at-speed frequency signals, without requiring long signal paths through multiple sectors between a centralized BIST circuit and the memory circuits being tested.

Figure 4:
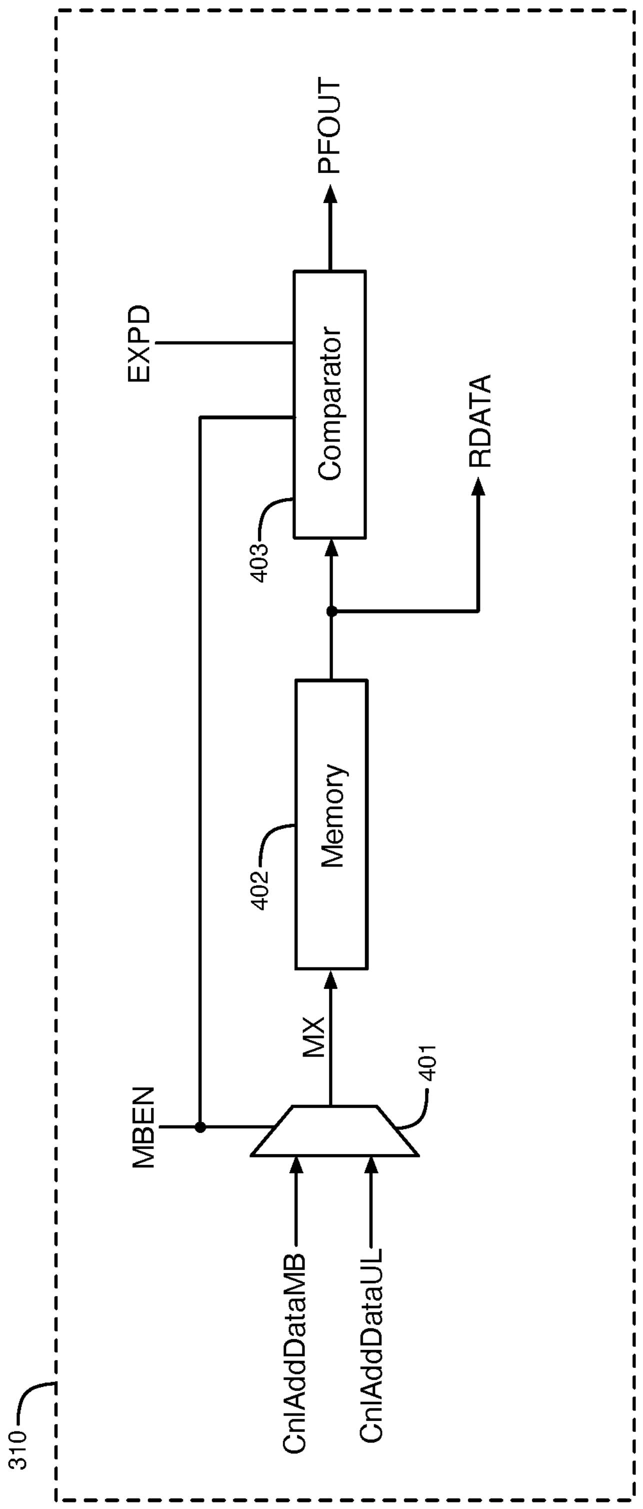
FIG. 4 is a diagram that illustrates an example of each of the built-in-self-test (BIST) enabled wrapper circuits shown in FIG. 3 in each of the sectors in the IC of FIG. 1.

FIG. 4 is a diagram that illustrates an example of a built-in-self-test (BIST) enabled wrapper circuit 310. The BIST enabled wrapper circuit 310 shown in FIG. 4 is an example of each of the BIST enabled wrapper circuits 310A-310F of FIG. 3 in each of the sectors in IC 100. As shown in FIG. 4, each of the BIST enabled wrapper circuits 310 includes a multiplexer circuit 401, a memory circuit 402, and a comparator circuit 403. BIST circuit 305 generates signals that are provided to the wrapper circuits 310 through busses 311-312 for controlling the memory tests of the memory circuits 402. The signals that are generated by the BIST circuit 305 and provided to each of the wrapper circuits 310 through one of busses 311-312 include a memory BIST enable signal MBEN that is provided to a select input of multiplexer circuit 401 and to comparator circuit 403, memory BIST control, address, and data signals CnlAddDataMB that are provided to first data inputs of multiplexer circuit 401, and expected data signals EXPD that are provided to inputs of comparator circuit 403. Additional control, address, and data signals CnlAddDataUL are provided to second data inputs of multiplexer circuit 401 from user logic circuits (e.g., programmable logic circuits) in IC 100.

Figure 5:
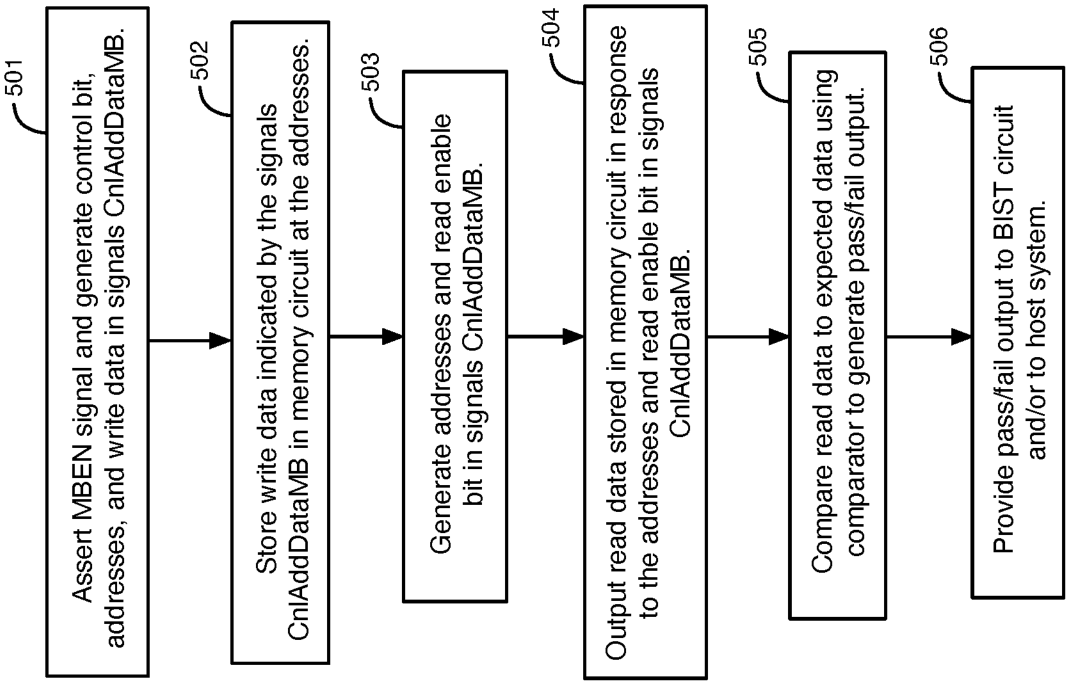
FIG. 5 is a flow chart that illustrates examples of operations that may be used to perform a memory test of a memory circuit in a sector of an IC using a BIST circuit in the sector.

FIG. 5 is a flow chart that illustrates examples of operations that may be used to perform a memory test of a memory circuit in a sector of an IC using a BIST circuit in the sector. In operation 501, the BIST circuit 305 generates a memory BIST control bit, one or more addresses, and write data in signals CnlAddDataMB and asserts the MBEN enable signal to a first predefined logic state. In response to the first predefined logic state in the MBEN enable signal, multiplexer circuit 401 provides the values of the memory BIST control bit, the one or more addresses, and the write data in signals CnlAddDataMB to memory circuit 402. In operation 502, memory circuit 402 stores the write data indicated by a first subset of signals CnlAddDataMB at the one or more addresses indicated by a second subset of signals CnlAddDataMB in response to a write enable control bit indicated by one of signals CnlAddDataMB. In operation 503, the BIST circuit 305 generates one or more addresses and a read enable bit in signals CnlAddDataMB. In operation 504, memory circuit 402 outputs read data stored in memory circuit 402 at the addresses indicated by signals CnlAddDataMB as read data signals RDATA in response to the read enable bit indicated by signals CnlAddDataMB. The memory circuit 402 accesses the read data from memory cells at the addresses indicated by signals CnlAddDataMB. The read data signals RDATA are provided to second inputs of comparator circuit 403 and optionally to user logic circuits.

In operation 505, comparator circuit 403 compares the read data indicated by signals RDATA to the expected data indicated by signals EXPD to generate a pass/fail output PFOUT when the MBEN signal has the first predefined logic state. If each of the read data bits indicated by read data signals RDATA matches the digital value of a corresponding bit of the expected data indicated by signals EXPD, then the comparator circuit 403 generates a pass value in the output PFOUT. If any of the read data bits indicated by read data signals RDATA does not match the digital value of a corresponding bit of the expected data indicated by signals EXPD, then the comparator circuit 403 generates a value indicating a failure in the output PFOUT.

In operation 506, the value of the pass/fail output PFOUT of the comparator circuit 403 is provided to BIST circuit 305 and/or the host system 308. For example, the value of the pass/fail output PFOUT of the comparator circuit 403 can be provided to the host system 308 through the BIST circuit 305, the PIO interface 304, the LSM controller 303, one of busses 306-307, SDM controller 301, and input/output terminals 302. Because the BIST control, data, address, and test result signals are generated and provided using the LSM controller 303, PIO interface 304, and the BIST circuit 305 in each sector, the control, address, data, and test result signals do not need to be routed to other input/output terminals of the IC.

According to some examples, a circuit design tool may generate configuration data for configuring the memory BIST circuitry of FIGS. 3-4, including BIST circuit 305 and the BIST enabled wrapper circuits 310, in one or more sectors of the IC for one or more of the memory circuits 402 in each sector. After a user selects an option in a user interface to enable the memory BIST circuitry for a circuit design for the IC, the circuit design tool automatically inserts the memory BIST circuitry into the circuit design. Enablement of the memory BIST circuitry may be transparent to a user of the circuit design tool. A user can access the memory circuits 402 in each sector with or without the memory BIST circuitry. For example, user address, control, and data signals CnlAddDataUL for accessing data in the memory circuit 402 may be provided to the memory circuit 402 through multiplexer circuit 401 in response to the enable signal MBEN being set to a second predefined logic state by BIST circuit 305. Also, the read data accessed from the memory circuit 402 and indicated by the read data signals RDATA may be provided to other user logic circuits in the sector or to other circuitry outside the sector.

According to some examples, a user of the circuit design tool can enable the insertion of memory BIST circuitry into a sector in a circuit design for an IC by selecting a memory wrapper function or by explicitly instructing the circuit design tool to create the memory BIST circuitry. The circuit design tool then automatically generates configuration data for the memory BIST circuitry and inserts the memory BIST circuitry in the selected sectors. A user can also proceed with designing the circuit design using the circuit design tool without enabling the memory BIST circuitry in one or more sectors.

After a sector is configured with the configuration data generated by the circuit design tool, the host system 308 can run memory tests of the memory circuits in the sector using the memory BIST circuitry of FIGS. 3-4 by providing commands through the input/output terminals 302. The host system 308 can halt operation of the IC 100 and generate an alarm in response to the PFOUT output indicating that a failure has been detected in one or more of the memory circuits 402. As a more specific example, a user can generate a memory object file that only contains memory BIST control information. The host system 308 can then load the memory object file to the IC 100 to run the memory BIST circuitry and receive a test result from the memory BIST circuitry before loading other memory bits to the IC. This process reduces the use of routing resources by the memory BIST circuitry. The memory object file can also be used as a diagnostics tool when system failure occurs to determine if the cause of the failure is a memory failure. The memory object file can also be used as a production test in manufacturing.

It can be a significant undertaking to design and implement a user (custom) logic circuit design in a programmable logic integrated circuit (IC). Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic IC according to the user design.

Figure 6:
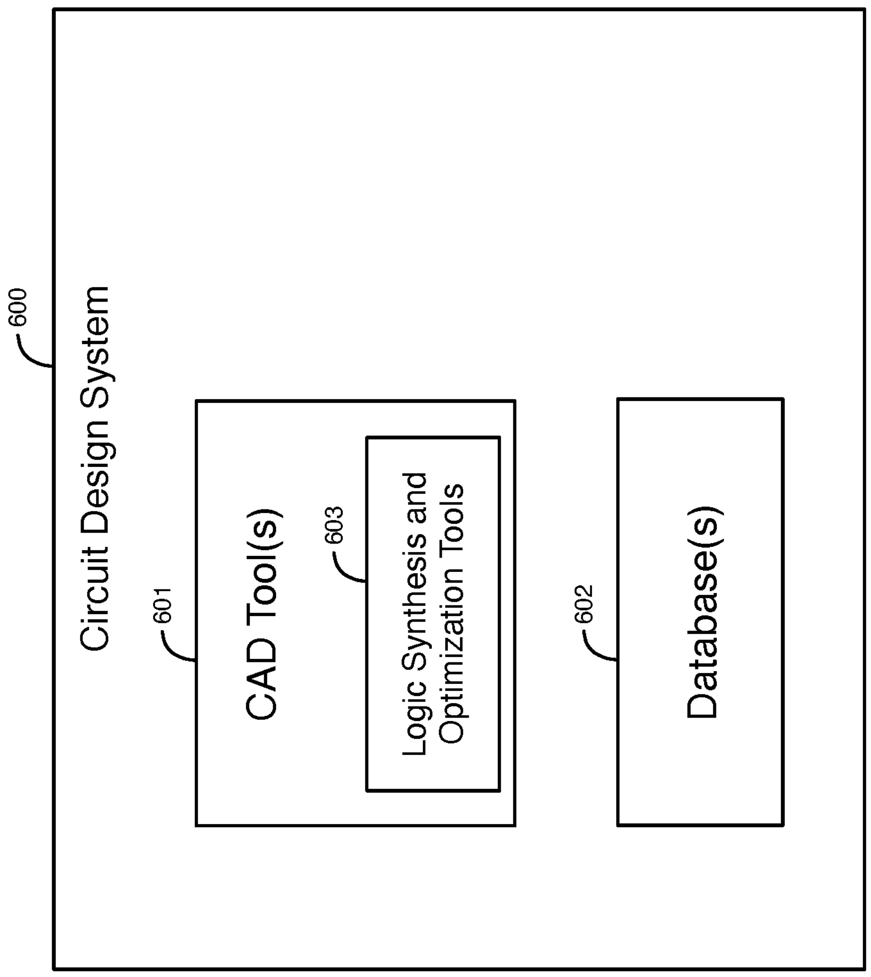
FIG. 6 is a diagram of an example of an illustrative circuit design system that may perform techniques disclosed herein.

FIG. 6 is a diagram of an example of an illustrative circuit design system 600 that may perform techniques disclosed herein. Circuit design system 600 may be implemented on integrated circuit design computing equipment. Circuit design system 600 may, for example, include one or more networked computers with processors, memory, mass storage, input/output devices, etc. System 600 may, for example, be based on one or more processors such as personal computers, workstations, etc. The processor(s) may be linked using a network (e.g., a local or wide area network). Memory in these computers or external memory and storage devices may be used to store instructions and data.

Software-based components such as computer-aided design (CAD) tools 601 and databases 602 reside on system 600. During operation, executable software such as the software of computer aided design tools 601 runs on the processor(s) of system 600. Databases 602 are used to store data for the operation of system 600. In general, software and data may be stored in non-transitory computer readable storage media (e.g., tangible computer readable storage media).

CAD tools 601 may include logic synthesis and optimization tools 603. Once the functional operation of the circuit design has been determined to be satisfactory, the logic synthesis and optimization tools 603 may generate a gate-level netlist of the circuit design, for example, using gates from a particular library pertaining to a targeted process supported by a foundry that has been selected to produce the integrated circuit. Alternatively, the logic synthesis and optimization tools 603 may generate a gate-level netlist of the circuit design using gates of a targeted programmable IC (i.e., in the logic and interconnect resources of a particular programmable IC product or product family).

The logic synthesis and optimization tools 603 may optimize the circuit design by making appropriate selections of hardware to implement different logic functions in the circuit design based on the circuit design data and constraint data entered by the logic designer. As an example, the logic synthesis and optimization tools 603 may perform multi-level logic optimization and technology mapping based on the length of a combinational path between registers in the circuit design and corresponding timing constraints that were entered by the logic designer.

After logic synthesis and optimization, the circuit design system 600 may use tools such as placement, routing, and physical synthesis tools to perform physical design steps (layout synthesis operations). These tools can be used to determine where to place each gate of the gate-level netlist in the IC. These tools create orderly and efficient implementations of circuit designs for any targeted integrated circuit (e.g., for a given programmable integrated circuit such as a field-programmable gate array (FPGA)).

Software stored on the non-transitory computer readable storage media may be executed on system 600. When the software of system 600 is installed, the storage of system 600 has instructions and data that cause the computing equipment in system 600 to execute various methods (processes). When performing these processes, the computing equipment is configured to implement the functions of circuit design system 600.

The computer aided design (CAD) tools 601, some or all of which are sometimes referred to collectively as a CAD tool, a circuit design tool, or an electronic design automation (EDA) tool, may be provided by a single vendor or by multiple vendors. Tools 601 may be provided as one or more suites of tools (e.g., a compiler suite for performing tasks associated with implementing a circuit design in a programmable IC) and/or as one or more separate software components (tools). Database(s) 602 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

In general, software and data for performing any of the functions disclosed herein may be stored in non-transitory computer readable storage media. Non-transitory computer readable storage media is tangible computer readable storage media that stores data for a significant period of time, as opposed to media that only transmits propagating electrical signals (e.g., wires). The software code may sometimes be referred to as software, data, program instructions, instructions, or code. The non-transitory computer readable storage media may, for example, include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Figure 7:
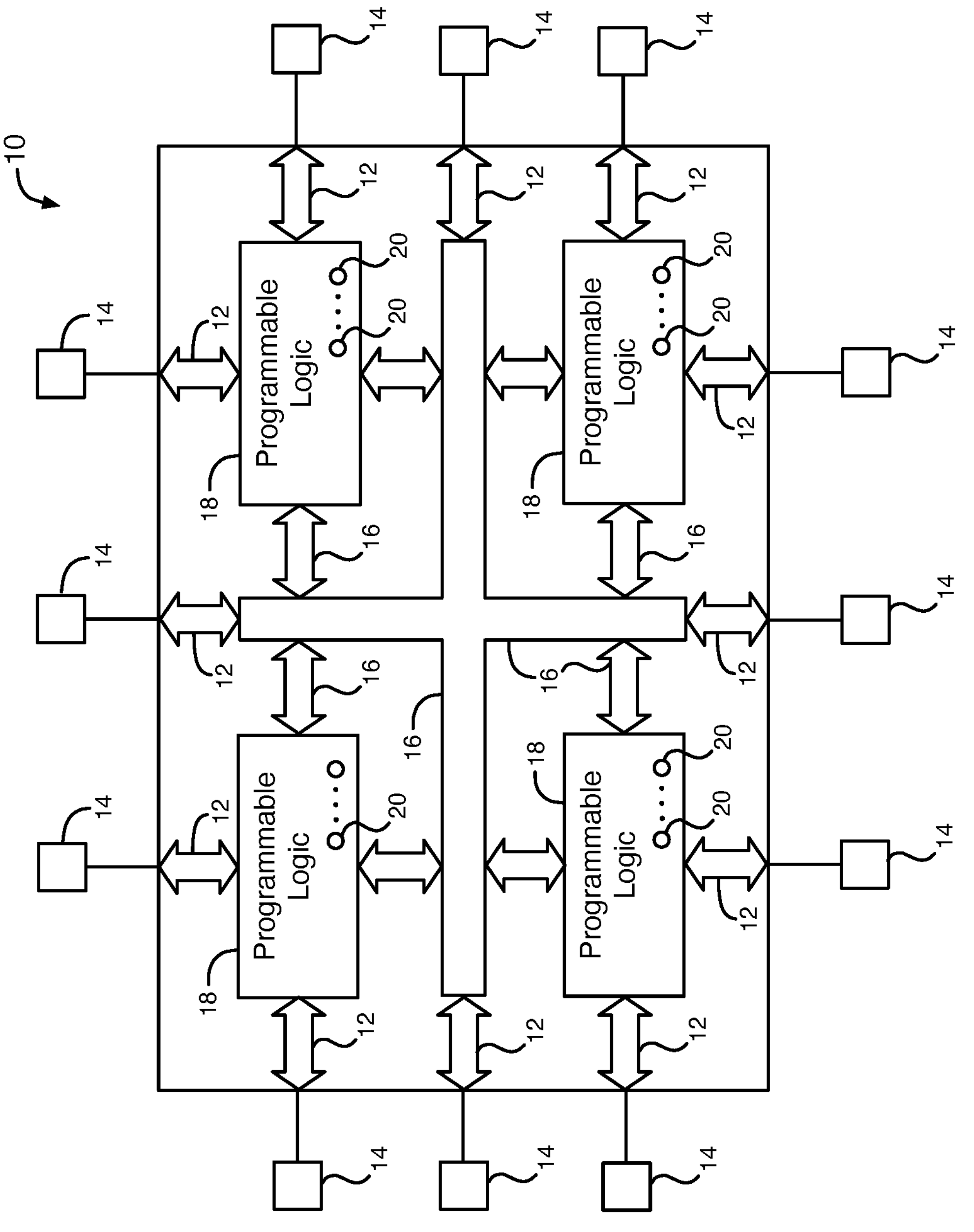
FIG. 7 is a diagram of an illustrative programmable (i.e., configurable) logic integrated circuit (IC) that may be programmed according to a user circuit design as disclosed herein.

FIG. 7 is a diagram of an illustrative programmable (i.e., configurable) logic integrated circuit (IC) 10 that may be programmed according to a user circuit design as disclosed herein. As shown in FIG. 7, programmable logic integrated circuit 10 may have input-output circuitry 12 for driving signals off of IC 10 and for receiving signals from other devices via input-output pads 14. Interconnection resources 16 such as global, regional, and local vertical and horizontal conductive lines and buses may be used to route signals on IC 10. Interconnection resources 16 include fixed interconnects (conductive lines) and programmable interconnects (i.e., programmable connections between respective fixed interconnects). Programmable logic circuitry 18 may include combinational and sequential logic circuitry. Programmable logic circuitry 18 may be configured to perform custom logic functions.

Programmable logic IC 10 contains memory elements 20 that can be loaded with configuration data using pads 14 and input-output circuitry 12. Once loaded, the memory elements 20 may each provide a corresponding static control output signal that controls the state of an associated logic component in programmable logic circuitry 18. Typically, the memory element output signals are used to control the gates of field-effect transistors. In the context of programmable integrated circuits, the memory elements 20 store configuration data and are sometimes referred to as configuration random-access memory (CRAM) cells. The configuration data programs the programmable logic 18 to perform the custom logic functions according to the circuit design.

Further examples are now described. Example 1 is an integrated circuit comprising sectors of logic circuits, wherein each of the sectors of logic circuits further comprises: a local sector manager controller circuit that provides an indication to perform a memory test; a built-in-self-test (BIST) circuit configurable to generate a first control signal and expected data in response to the indication to perform the memory test; a memory circuit that outputs read data in response to the first control signal during the memory test; and a comparator circuit configurable to compare the read data with the expected data during the memory test to generate a test result that is provided to the BIST circuit.

In Example 2, the integrated circuit of Example 1 may optionally include, wherein each of the sectors of logic circuits further comprises: a multiplexer circuit configurable to provide the first control signal and first address signals from the BIST circuit to the memory circuit during the memory test, wherein the multiplexer circuit is configurable to provide a second control signal and second address signals to the memory circuit during a user mode.

In Example 3, the integrated circuit of any one of Examples 1-2 may optionally include, wherein each of the sectors of logic circuits further comprises: a parallel input/output interface circuit that provides the indication to the BIST circuit and that provides the test result to the local sector manager controller circuit.

In Example 4, the integrated circuit of any one of Examples 1-3 may further comprise: a secure device manager controller circuit that receives a command to perform the memory test through an input terminal of the integrated circuit, wherein the secure device manager controller circuit provides the command to the local sector manager controller circuit, and wherein the local sector manager controller circuit provides the indication to perform the memory test to the BIST circuit in response to the command.

In Example 5, the integrated circuit of Example 4 may optionally include, wherein the BIST circuit provides the test result to the local sector manager controller circuit, and wherein the local sector manager controller circuit provides the test result to the secure device manager controller circuit.

In Example 6, the integrated circuit of any one of Examples 1-5 may optionally include, wherein the integrated circuit is a programmable logic integrated circuit, and wherein the logic circuits are programmable logic circuits.

In Example 7, the integrated circuit of Example 2 may optionally include, wherein the multiplexer circuit is configurable in response to an enable signal generated by the BIST circuit, and wherein the comparator circuit is configurable to compare the read data with the expected data during the memory test in response to the enable signal.

In Example 8, the integrated circuit of any one of Examples 1-7 may optionally include, wherein each of the sectors of logic circuits further comprises: an additional memory circuit that outputs additional read data in response to a second control signal generated by the BIST circuit during the memory test; and an additional comparator circuit configurable to generate an additional test result based on a comparison between the additional read data and additional expected data generated by the BIST circuit during the memory test.

Example 9 is a method for performing a built-in-self-test of a memory circuit in a sector of an integrated circuit, the method comprising: providing an indication to perform the built-in-self-test from a local sector manager controller circuit in the sector; generating a first control signal and expected data using a built-in-self-test circuit in the sector in response to the indication to perform the built-in-self-test; providing the first control signal to the memory circuit using a multiplexer circuit; outputting read data from the memory circuit during the built-in-self-test in response to the first control signal received from the multiplexer circuit; and comparing the read data to the expected data using a comparator circuit during the built-in-self-test to generate a test result.

In Example 10, the method of Example 9 may further comprise: providing the test result from the comparator circuit to the built-in-self-test circuit.

In Example 11, the method of any one of Examples 9-10 may further comprise: generating address signals at the built-in-self-test circuit; providing the address signals from the built-in-self-test circuit to the memory circuit through the multiplexer circuit during the built-in-self-test; and accessing the read data in the memory circuit at addresses indicated by the address signals.

In Example 12, the method of any one of Examples 9-11 may optionally include, wherein providing the indication to perform the built-in-self-test further comprises: providing the indication to perform the built-in-self-test through a parallel input/output interface circuit to the built-in-self-test circuit.

In Example 13, the method of any one of Examples 9-12 may further comprise: receiving a command to perform the built-in-self-test at a secure device manager circuit in the integrated circuit from a host system through an input terminal of the integrated circuit; and providing the command from the secure device manager circuit to the local sector manager controller circuit.

In Example 14, the method of any one of Examples 9-13 may further comprise: providing a second control signal from a user logic circuit to the memory circuit using the multiplexer circuit in response to an enable signal generated by the built-in-self-test circuit.

In Example 15, the method of any one of Examples 9-13 may further comprise: generating a second control signal and additional expected data using the built-in-self-test circuit in response to the indication to perform the built-in-self-test; providing the second control signal to an additional memory circuit; outputting additional read data from the additional memory circuit during the built-in-self-test in response to the second control signal; and comparing the additional read data to the additional expected data using an additional comparator circuit to generate an additional test result.

Example 16 is a non-transitory computer-readable storage medium comprising instructions stored thereon for causing a computer to execute a method for creating a circuit design for an integrated circuit using a circuit design tool, the method comprising: receiving a response to an option to insert a built-in-self-test circuit for testing a memory circuit in a sector of the integrated circuit; and generating configuration data for configuring the built-in-self-test circuit and a wrapper circuit in the circuit design based on receiving the response to the option that indicates to insert the built-in-self-test circuit into the circuit design, wherein the configuration data configures the wrapper circuit to comprise a multiplexer circuit coupled to the built-in-self-test circuit, the memory circuit coupled to the multiplexer circuit, and a comparator circuit coupled to the memory circuit for comparing an output of the memory circuit with expected data from the built-in-self-test circuit to generate a test result.

In Example 17, the non-transitory computer-readable storage medium of Example 16 may optionally include, wherein the configuration data configures the built-in-self-test circuit to provide a control signal to the memory circuit through the multiplexer circuit in response to an indication to perform a test of the memory circuit from a local sector manager circuit in the sector.

In Example 18, the non-transitory computer-readable storage medium of Example 17 may optionally include, wherein the memory circuit is configured to generate the output in response to the control signal received from the built-in-self-test circuit through the multiplexer circuit.

In Example 19, the non-transitory computer-readable storage medium of any one of Examples 16-18 may optionally include, wherein the configuration data configures the comparator circuit to provide the test result to the built-in-self-test circuit.

In Example 20, the non-transitory computer-readable storage medium of any one of Examples 16-19 may optionally include, wherein the configuration data configures the built-in-self-test circuit to provide address signals to the memory circuit through the multiplexer circuit, and wherein the memory circuit is configured to provide read data in the output that is stored at addresses indicated by the address signals.

The foregoing description of the examples has been presented for the purpose of illustration. The foregoing description is not intended to be exhaustive or to be limiting to the examples disclosed herein. In some instances, features of the examples can be employed without a corresponding use of other features as set forth. Many modifications, substitutions, and variations are possible in light of the above teachings.

What is claimed is:

1. An integrated circuit comprising sectors of logic circuits, wherein each of the sectors of logic circuits comprises:

a secure device manager controller circuit that receives a command to perform a memory test through an input terminal of the integrated circuit;

a local sector manager controller circuit, wherein the secure device manager controller circuit provides the command and configuration data to the local sector manager controller circuit;

a built-in-self-test (BIST) circuit, wherein the local sector manager controller circuit provides an indication to perform the memory test to the BIST circuit in response to the command, wherein the BIST circuit is configurable with the configuration data to generate a first control signal, wherein the BIST circuit generates first expected data and second expected data in response to the indication to perform the memory test;

a first memory circuit that outputs first read data in response to the first control signal during the memory test;

a first comparator circuit configurable with the configuration data to compare the first read data with the first expected data during the memory test to generate a first test result that is provided to the BIST circuit, wherein the first comparator circuit is separate from the BIST circuit;

a second memory circuit that outputs second read data in response to a second control signal generated by the BIST circuit during the memory test; and a second comparator circuit configurable with the configuration data to generate a second test result based on a comparison between the second read data and the second expected data during the memory test, wherein the second test result is provided to the BIST circuit.

2. The integrated circuit of claim 1, wherein each of the sectors of logic circuits further comprises:

a multiplexer circuit configurable to provide the first control signal and first address signals from the BIST circuit to the first memory circuit during the memory test, wherein the multiplexer circuit is configurable to provide a third control signal and second address signals to the first memory circuit during a user mode.

3. The integrated circuit of claim 2, wherein the multiplexer circuit is configurable in response to an enable signal generated by the BIST circuit, and wherein the first comparator circuit is configurable to compare the first read data with the first expected data during the memory test in response to the enable signal.

4. The integrated circuit of claim 1, wherein each of the sectors of logic circuits further comprises:

a parallel input/output interface circuit that provides the indication to the BIST circuit and that provides the first test result to the local sector manager controller circuit.

5. The integrated circuit of claim 1, wherein the secure device manager controller circuit is configured to receive the command and the configuration data from a host system through the input terminal.

6. The integrated circuit of claim 1, wherein the BIST circuit provides the first test result to the local sector manager controller circuit, and wherein the local sector manager controller circuit provides the first test result to the secure device manager controller circuit.

7. The integrated circuit of claim 1, wherein the integrated circuit is a programmable logic integrated circuit, and wherein the logic circuits are programmable logic circuits.

8. The integrated circuit of claim 1, wherein the first comparator circuit is separate from the local sector manager controller circuit, and wherein the second comparator circuit is separate from the BIST circuit.

9. The integrated circuit of claim 1, wherein each of the sectors of logic circuits further comprises:

a multiplexer circuit configurable to provide write data from the BIST circuit to the first memory circuit during the memory test.

10. The integrated circuit of claim 9, wherein the multiplexer circuit is configurable to provide addresses and a read enable bit to the first memory circuit, and wherein the first memory circuit outputs the first read data at the addresses in response to the read enable bit during the memory test.

11. A method for performing a built-in-self-test of first and second memory circuits in each one of sectors of logic circuits in an integrated circuit, the method comprising:

receiving a command to perform the built-in-self-test at a secure device manager circuit in the integrated circuit from a host system through an input terminal of the integrated circuit;

providing the command and configuration data from the secure device manager circuit to a local sector manager controller circuit in each of the sectors of logic circuits in the integrated circuit;

providing an indication to perform the built-in-self-test from the local sector manager controller circuit in each of the sectors of logic circuits in response to the command;

generating a first control signal and first expected data using a built-in-self-test circuit in each of the sectors in response to the indication to perform the built-in-self-test;

providing the first control signal to the first memory circuit using a multiplexer circuit in each of the sectors;

outputting first read data from the first memory circuit in each of the sectors during the built-in-self-test in response to the first control signal received from the multiplexer circuit;

comparing the first read data to the first expected data using a first comparator circuit in each of the sectors during the built-in-self-test to generate a first test result, wherein the first comparator circuit is separate from the built-in-self-test circuit;

generating a second control signal and second expected data using the built-in-self-test circuit in each of the sectors in response to the indication to perform the built-in-self-test;

providing the second control signal to the second memory circuit in each of the sectors;

outputting second read data from the second memory circuit in each of the sectors during the built-in-self-test in response to the second control signal; and comparing the second read data to the second expected data using a second comparator circuit in each of the sectors to generate a second test result, wherein the built-in-self-test circuit, the first comparator circuit, and the second comparator circuit are configurable with the configuration data.

12. The method of claim 11 further comprising:

providing the first test result from the first comparator circuit to the built-in-self-test circuit.

13. The method of claim 11 further comprising:

generating address signals at the built-in-self-test circuit;

providing the address signals from the built-in-self-test circuit to the first memory circuit through the multiplexer circuit during the built-in-self-test; and accessing the first read data in the first memory circuit at addresses indicated by the address signals.

14. The method of claim 11, wherein providing the indication to perform the built-in-self-test further comprises:

providing the indication to perform the built-in-self-test through a parallel input/output interface circuit to the built-in-self-test circuit.

15. The method of claim 11 further comprising:

receiving the configuration data at the secure device manager circuit from the host system through the input terminal.

16. The method of claim 11 further comprising:

providing a third control signal from a user logic circuit to the first memory circuit using the multiplexer circuit in response to an enable signal generated by the built-in-self-test circuit.

17. The method of claim 11, wherein the first comparator circuit is separate from the local sector manager controller circuit, and wherein the second comparator circuit is separate from the built-in-self-test circuit.

18. The method of claim 11, wherein the integrated circuit is a programmable logic integrated circuit, and wherein the logic circuits are programmable logic circuits.

19. The method of claim 11 further comprising:

configuring the multiplexer circuit to provide a third control signal and address signals to the first memory circuit during a user mode of the integrated circuit.

20. The method of claim 11 further comprising:

configuring the multiplexer circuit in response to an enable signal generated by the built-in-self-test circuit; and configuring the first comparator circuit to compare the first read data with the first expected data during the built-in-self-test in response to the enable signal.

* * * * *